(12) United States Patent
Aria et al.

(10) Patent No.: US 9,115,424 B2
(45) Date of Patent: Aug. 25, 2015

(54) SIMPLE METHOD FOR PRODUCING SUPERHYDROPHOBIC CARBON NANOTUBE ARRAY

(75) Inventors: Adrianus I. Aria, Pasadena, CA (US); Masoud Beizai, Laguna Hills, CA (US); Morteza Gharib, San Marino, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 698 days.

(21) Appl. No.: 13/081,421

(22) Filed: Apr. 6, 2011

(65) Prior Publication Data

US 2011/0250376 A1  Oct. 13, 2011

Related U.S. Application Data

(60) Provisional application No. 61/321,831, filed on Apr. 7, 2010.

(51) Int. Cl.
| | |
|---|---|
| *C23C 16/00* | (2006.01) |
| *C23C 16/26* | (2006.01) |
| *B82Y 30/00* | (2011.01) |
| *B82Y 40/00* | (2011.01) |
| *C01B 31/02* | (2006.01) |
| *C23C 14/06* | (2006.01) |
| *C23C 14/58* | (2006.01) |
| *C23C 16/56* | (2006.01) |

(52) U.S. Cl.
CPC ............... *C23C 16/26* (2013.01); *B82Y 30/00* (2013.01); *B82Y 40/00* (2013.01); *C01B 31/026* (2013.01); *C01B 31/0253* (2013.01); *C23C 14/0605* (2013.01); *C23C 14/5853* (2013.01); *C23C 16/56* (2013.01); *Y10T 428/23993* (2013.01)

(58) Field of Classification Search
CPC ................ C23C 16/00; B82Y 40/00
USPC .............................. 427/248.1, 294
See application file for complete search history.

(56) References Cited

U.S. PATENT DOCUMENTS

| | | |
|---|---|---|
| 3,964,482 A | 6/1976 | Gerstel et al. |
| 4,842,390 A | 6/1989 | Sottini et al. |
| 5,116,317 A | 5/1992 | Carson, Jr. et al. |
| 5,457,041 A | 10/1995 | Ginaven et al. |
| 6,256,533 B1 | 7/2001 | Yuzhakov et al. |

(Continued)

FOREIGN PATENT DOCUMENTS

| | | |
|---|---|---|
| EP | 1948562 B1 | 7/2010 |
| JP | 2006-114265 | 4/2006 |

(Continued)

OTHER PUBLICATIONS

Li, Huanjun, et al., "Super-"Amphiphobic" Aligned Carbon Nanotube Films". Angew. Chem. Int. Ed. 2001, 40, No. 9 pp. 1743-1746.*

(Continued)

*Primary Examiner* — Bret Chen
(74) *Attorney, Agent, or Firm* — One LLP

(57) ABSTRACT

Efficient methods for producing a superhydrophobic carbon nanotube (CNT) array are set forth. The methods comprise providing a vertically aligned CNT array and performing vacuum pyrolysis on the CNT array to produce a superhydrophobic CNT array. These methods have several advantages over the prior art, such as operational simplicity and efficiency.

2 Claims, 6 Drawing Sheets

(56) References Cited

U.S. PATENT DOCUMENTS

| | | |
|---|---|---|
| 6,334,856 B1 | 1/2002 | Allen et al. |
| 6,379,324 B1 | 4/2002 | Gartstein et al. |
| 6,471,903 B2 | 10/2002 | Sherman et al. |
| 6,503,231 B1 | 1/2003 | Prausnitz et al. |
| 6,533,949 B1 | 3/2003 | Yeshurun et al. |
| 6,720,547 B1 | 4/2004 | Rajadhyaksha et al. |
| 6,749,792 B2 | 6/2004 | Olson |
| 6,866,801 B1 | 3/2005 | Mau et al. |
| 6,924,335 B2 | 8/2005 | Fan et al. |
| 7,037,562 B2 | 5/2006 | Jimenez |
| 7,097,776 B2 | 8/2006 | Govinda Raju |
| 7,160,620 B2 | 1/2007 | Huang et al. |
| 7,183,003 B2 | 2/2007 | Leu et al. |
| 7,235,442 B2 | 6/2007 | Wang et al. |
| 7,291,396 B2 | 11/2007 | Huang et al. |
| 7,393,428 B2 | 7/2008 | Huang et al. |
| 7,396,477 B2 | 7/2008 | Hsiao |
| 7,438,844 B2 | 10/2008 | Huang et al. |
| 7,491,628 B2 | 2/2009 | Noca et al. |
| 7,534,648 B2 | 5/2009 | Raravikar et al. |
| 7,569,425 B2 | 8/2009 | Huang et al. |
| 7,611,628 B1 | 11/2009 | Hinds, III |
| 7,611,651 B2 | 11/2009 | Huang et al. |
| 7,695,769 B2 | 4/2010 | Watanabe et al. |
| 7,955,644 B2 | 6/2011 | Sansom et al. |
| 8,043,250 B2 | 10/2011 | Xu |
| 8,048,017 B2 | 11/2011 | Xu |
| 8,062,573 B2 | 11/2011 | Kwon |
| 8,257,324 B2 | 9/2012 | Prausnitz et al. |
| 8,377,590 B2 | 2/2013 | Park et al. |
| 8,976,507 B2 * | 3/2015 | Aria et al. .................. 361/502 |
| 2001/0023986 A1 | 9/2001 | Mancevski |
| 2002/0155737 A1 | 10/2002 | Roy et al. |
| 2002/0172820 A1 * | 11/2002 | Majumdar et al. ........... 428/357 |
| 2003/0069548 A1 | 4/2003 | Connelly et al. |
| 2003/0119920 A1 * | 6/2003 | Wang et al. ................... 518/715 |
| 2003/0180472 A1 | 9/2003 | Zhou et al. |
| 2005/0011858 A1 | 1/2005 | Kuo et al. |
| 2005/0029223 A1 | 2/2005 | Yeshurun et al. |
| 2005/0067346 A1 * | 3/2005 | Noack et al. ................... 210/503 |
| 2005/0100960 A1 | 5/2005 | Dai et al. |
| 2005/0127351 A1 | 6/2005 | Tolt |
| 2005/0157386 A1 | 7/2005 | Greenwald et al. |
| 2005/0167647 A1 | 8/2005 | Huang et al. |
| 2005/0171480 A1 | 8/2005 | Mukerjee et al. |
| 2005/0220674 A1 | 10/2005 | Shafirstein et al. |
| 2005/0230082 A1 | 10/2005 | Chen |
| 2005/0245659 A1 | 11/2005 | Chen |
| 2006/0030812 A1 | 2/2006 | Golubovic-Liakopoulos et al. |
| 2006/0057388 A1 | 3/2006 | Jin et al. |
| 2006/0073712 A1 | 4/2006 | Suhir |
| 2006/0084942 A1 | 4/2006 | Kim et al. |
| 2006/0093642 A1 | 5/2006 | Ranade |
| 2006/0118791 A1 | 6/2006 | Leu et al. |
| 2006/0184092 A1 | 8/2006 | Atanasoska et al. |
| 2006/0184112 A1 | 8/2006 | Horn et al. |
| 2006/0226016 A1 | 10/2006 | S/O Govinda Raju et al. |
| 2006/0231970 A1 | 10/2006 | Huang et al. |
| 2006/0286305 A1 * | 12/2006 | Thies et al. .................. 427/508 |
| 2007/0053057 A1 | 3/2007 | Zust et al. |
| 2007/0066934 A1 | 3/2007 | Etheredge et al. |
| 2007/0066943 A1 | 3/2007 | Prasad et al. |
| 2007/0081242 A1 | 4/2007 | Kempa et al. |
| 2007/0099311 A1 | 5/2007 | Zhou et al. |
| 2007/0114658 A1 | 5/2007 | Dangelo et al. |
| 2007/0207182 A1 | 9/2007 | Weber et al. |
| 2007/0244245 A1 | 10/2007 | Liu et al. |
| 2007/0276330 A1 | 11/2007 | Beck et al. |
| 2008/0009800 A1 | 1/2008 | Nickel |
| 2008/0199626 A1 | 8/2008 | Zhou et al. |
| 2008/0269666 A1 | 10/2008 | Wang et al. |
| 2008/0292840 A1 * | 11/2008 | Majumdar et al. ........... 428/114 |
| 2008/0318049 A1 | 12/2008 | Hata et al. |
| 2009/0032496 A1 | 2/2009 | Yao et al. |
| 2009/0068387 A1 | 3/2009 | Panzer et al. |
| 2009/0118662 A1 | 5/2009 | Schnall |
| 2009/0130370 A1 | 5/2009 | Sansom et al. |
| 2009/0208743 A1 | 8/2009 | Pettit |
| 2009/0269560 A1 | 10/2009 | Dhinojwala et al. |
| 2010/0075024 A1 | 3/2010 | Ajayan et al. |
| 2010/0196446 A1 | 8/2010 | Gharib et al. |
| 2010/0247777 A1 | 9/2010 | Nikolaev et al. |
| 2010/0253375 A1 | 10/2010 | Fang et al. |
| 2010/0330277 A1 * | 12/2010 | Ajayaghosh et al. ......... 427/240 |
| 2011/0045080 A1 | 2/2011 | Powis et al. |
| 2011/0233779 A1 | 9/2011 | Wada et al. |
| 2011/0250376 A1 | 10/2011 | Aria et al. |
| 2012/0021164 A1 | 1/2012 | Sansom et al. |
| 2012/0058170 A1 | 3/2012 | Gharib et al. |
| 2013/0178722 A1 | 7/2013 | Aria et al. |

FOREIGN PATENT DOCUMENTS

| | | |
|---|---|---|
| JP | 2006-164835 | 6/2006 |
| TW | 253 898 | 4/2006 |
| TW | 256 877 | 6/2006 |
| WO | WO 96/21938 A1 | 7/1996 |
| WO | WO 2006/041535 A1 | 4/2006 |
| WO | PCT/US2008/012641 | 12/2009 |
| WO | PCT/US2007/015754 | 1/2010 |
| WO | PCT/US2007/015754 | 2/2010 |
| WO | PCT/US2008/012641 | 5/2010 |
| WO | WO 2010/087971 A2 | 8/2010 |
| WO | WO 2010/120564 A2 | 10/2010 |
| WO | PCT/US2010/000243 | 11/2010 |
| WO | PCT/US2010/000243 | 8/2011 |
| WO | PCT/US2011/031465 | 12/2011 |
| WO | PCT/US2012/069941 | 2/2013 |
| WO | WO 2013/090844 | 6/2013 |
| WO | PCT/US2013/052580 | 10/2013 |
| WO | PCT/US2012/069941 | 6/2014 |

OTHER PUBLICATIONS

Wang, Z., et al., "Impact dynamics and rebound of water droplets on superhydrophobic carbon nanotube arrays". Applied Physics Letters 91, 023105 (2007), pp. 1-3.*

Zhu, Lingbo, et al., "Superhydrophobicity on Two-Tier Rough Surfaces Fabricated by Controlled Growth of Aligned Carbon Nanotube Arrays Coated with Fluorocarbon". Langmuir 2005, 21, 11208-11212.*

Lau, Kenneth K.S., et al., "Superhydrophobic Carbon Nanotube Forests". NanoLetters 2003, vol. 3 No. 12, 1701-1705.*

Kim, Youn-Su, et al., "Out-of-plane growth of CNTs on graphene for supercapacitor applications". Nanotechnology 23 (2012) 015301, pp. 1-7.*

Hsieh, Chien-Te, et al., "Superhydrophobic behavior of fluorinated carbon nanofiber arrays". Applied Physics Letters, 88, 234120, (2006) pp. 1-3.*

Wang, Z., et al., "Impact dynamics and rebound of water droplets on superhydrophobic carbon nanotube arrays". Applied Physics Letters, 91, 023105 (2007) pp. 1-3.*

Daniello, Robert J. et al., "Drag reduction in turbulent flows over superhydrophobic surfaces," *Physics of Fluids*, 21:085103-1 to 085103-9 (2009).

Han, Z. J. et al., "Superhydrophobic amorphous carbon/carbon nanotube nanocomposites," *Applied Physics Letters*, 94:223106-1 to 223106-3 (2009).

Hong, Yong Cheol and Uhm, Han Sup, "Superhydrophobicity of a material made from multiwalled carbon nanotubes," *Applied Physics Letters*, 88:24401-1 to 24401-3 (2006).

Huang, L. et al., "Stable Superhydrophobic Surface via Carbon Nanotubes Coated with a ZnO Thin Film," *J. Phys. Chem. B*, 109:7746-7748 (2005).

Lau, Kenneth K. S. et al., "Superhydrophobic Carbon Nanotube Forests," *Nano Letters*, 3(12): 1701-1705 (2003).

Li, Shuhong et al., "Suber-Hydrophobicity of Large-Area Honeycomb-Like Aligned Carbon Nanotubes," *J. Phys. Chem. B*. 106:9274-9276 (2002).

(56) References Cited

OTHER PUBLICATIONS

Men, Xue-Hu et al., Superhydrophobic/superhydrophilic surfaces from a carbon nanotube based composite coating, *Appl Physics A*, published online: Sep. 22, 2009.
Min, Taegee and Kim, John, "Effects of hydrophobic surface on skin-friction drag," *Physics of Fluids*, 16(7):L55-L58 (2004).
Sansom, Elijah B et al., "Controlled partial embedding of carbon nanotubes within flexible transparent layers," *Nanotechnology*, 19:035302-1 to 035302-6 (2008).
Zhang, Liang and Resasco, Daniel E., "Single-Walled Carbon Nanotube Pillars: A Superhydrophobic Surface," *Langmuir*, 25(8):4792-4798 (2009).
International Search Report and Written Opinion, PCT Application No. PCT/US2011/031465, date of mailing Dec. 27, 2011, 7 pages.
Ajayan, P.M., et al., "Aligned Carbon Nanotube Arrays Formed by Cutting a Polymer Resin-Nanotube Composite", Science. vol. 265. No. 5176, Aug. 1994, pp. 1212-1214.
Anderson, A., et al., "High sensitivity assays for docetaxel and paclitaxel in plasma using solid-phase extraction arid high-performance liquid chromatography with UV detection", BMC Clinical Pharmacology, Jan. 2006, vol. 6, Issue 2, pp. 1-10.
Arakawa, K., et al., "Flourescence Analysis of Biochemical Constituents Identifies Atherosclerotic Plaque With a Thin Fibrous Cap", Arterioscler: Thromb. Vasc. Biol., 2002, vol. 22, pp. 1002-1007.
Aria, A.I., et al., "Reversible Tuning of the Wetability of Carbon Nanotube Arrays: The Effect of Ultraviolet/Ozone and Vacuum Pyrolysis Treatments", Langmuir, 2011, vol. 27, pp. 9005-9011.
Arifin, D.Y., et al., "Role of Convective Flown Carmustine Delivery to a Brain Tumor", Pharmaceutical Research, 2009,17, pp. 1-14.
Barber, A.H. et al., "Static and Dynamic Wetting Measurements of Single Carbon Nanotubes", Physical Review Letters, vol. 92, No. 18, May 2004,pp. 186103-1-186103-4.
Boldor, D., et al, "Temperature Measurement of Carbon Nanotubes Using Infrared Thermegraphy", Chem, Matter. vol. 20, No. 12, 2008, pp. 4011-4016.
Boo, H., et al., "Electrochemical Nanoneedle Biosensor Based on Multiwell Carbon Nanotube", Anal Chem., vol. 78, No, 2, 2006, pgs, 617-620,.
Borca-Tasciuc, T., et al., "Anisotropic Thermal Diffusivity Characterization of Aligned Carbon Nanotube-Polymer Composites", Journal of Nanoscience and Nanotechnology, vol. 7, No. 4, 2007, pp. 1581-1588.
Boyea, J.M. et al., "Carbon Nanotube-Based Supercapacitors: Technologies and Markets", Nanotechnology Law & Business, Mar. 2007, vol. 4, No. 1, pp. 585-593.
Bronikowski, M.J., "CVD growth of carbon nanotube bundle arrays". Carbon, 2006, vol. 44, pp. 2822-2832.
Bronkowski, M.J., "Longer Nanotubes of Lower Temperatures: The Influence of Effective Activation Energies on Carbon Nanotube Growth by Thermal Chemical Vapor Deposition", J. Phys. Chem. C, vol. 111, No. 48, 2007, pp. 17705-17712.
Celermajer, D.S., "Understanding the pathophysiology of the arterial wall: which method should we choose?", European Heart Journal Supplements, 2002, vol. 4, Supplement F, pp. F24-F28.
Chen, Chuan-Hua, et al., "Dropwise condensation on superhydrophobic surfaces with two-tier roughnes", Appl. Phys. Ltrs., 2007, vol. 90, pp. 173108-1-173108-3.
Chen, J., et al., "Functionalized Single-Walles Carbon Nanotubes as Rationally Designed Vehicles for Tumor-Targeted Drug Delivery". J. Am. Chem. Soc., 2008, vol. 130, pp. 16778-16785.
Cheng, Li et al., "A fullerene-single wall carbon nanotube comples for polymer bulk hetrojunction photovoltaic cells", J. Matter, Chem., 2007, vol. 17, pp. 2406-2411.
Choi, T.Y., et al., "Measurement of thermal conductivity of individual multiwalled carbon nanotubes by the 3-ω method", Appl. Phys. Letters, vol. 87, No. 1, 2005, pp. 013108-1-013108-3.
Conway, B.E., "Electromechanical Supercapacitors: Scientific Fundamentals and Technological Applications", Chapter 2-Similarities and Differences between Supercapacitors and Batteries for Storing Electrical Energy, 1999, pp. 11-31.

Correa-Duarte, M.A., et al., "Fabrication and Biocompatibility of Carbon Nanotube-Based 3D Networks as Scaffolds for Cell Seeding and Growth", Nano Letters, 2004, vol. 4, No. 11, pp. 2233-2236.
Correa-Duarte, M.A., et al., "Nanoengineered Polymeric Thin Films By Sintering CNT-Coated Polystyrene Spheres", Small, vol. 2, No. 2, 2006, pp. 220-224.
Crabtree, G.W., et al., "Solar energy conversion", Physics Today, vol. 60, No. 3, 2007, pp. 37-42.
Creel, C.J., et al., "Arterial Paclitaxel Distribution and Deposition", Circ. Res., vol. 86, No. 8, 2000, pp. 879-884.
Cui, D., et al., "Effect of single wall carbon nanotubes on human HEK293 cells", Toxicology Letters, 2005, vol. 155, pp. 73-85.
Dai, L., et al., "Functionalized surfaces based on polymers and carbon nanotubes for some biochemical and optoelectronic applications", Nanotechnology, vol. 14, No. 10, 2003, pp. 1084-1097.
Daraio, C., et al., "Highly nonlinear contact interaction and dynamic energy dissipation by forest of carbon nantubes", Appl. Phys. Ltrs., vol. 85, No. 23, pp. 5724-5726.
Davies, M.J., "The Composition of Coronary-Artery Plaques", The New England Journal of Medicine, 1997, vol. 336, No. 18, pp. 1312-1314.
Davis, S. P., et al., "Insertion of microneedles into skin: measurement and prediction of insertion force and needle fracture force", Journal of Biomechanics, 2004, vol. 34, pp. 1155-1163.
Detter, C., et al., "Fluorescent Cardiac Imaging: A Novel Intraoperative Method for Quantitive Assessment of Myocardial Perfusion During Graded Corornary Artery Stenosis", Circulation, 2007, vol. 116, pp. 1007-1014.
Diaz, J.F., et al., "Macromolecular Accessibility of Flourescent Taxiods Bound at a PacitaxelBinding Site in the Microtube Surface", J. Biol. Chem., 2005, vol. 280, pp. 3928-3937.
Elias, K.L., et al., "Enhanced functions of osteoblasts on nanometer diameter carbon fibers", Biomaterials, 2002, vol. 23, pp. 3279-3287.
Falvo, M.R., et al., "Bending and bucking of carbon nanotubes under large strain", Nature, vol. 389, 1997, pp. 582-584.
Fan, S., et al., "Self-Oriented Regular Arrays of Carbon Nantubes and Their Field Emission Properties", Science. vol. 283. Jan. 1999, pp. 512-514.
Firkowska, I. et al., Highly Ordered MWNT-Based Matrixes: Topograohy at the Nanscale Conceived for Tissue Engineering, Langmuir, vol. 22, 2006. pp. 5427-5434.
Frank, S., et al., "Carbon Nanotube Quantum Resisters", Science, vol. 280, 1998, pp. 1744-1746.
Futaba, D.N., et al., "Shape-engineerable and highly densely packed single-walled carbon nanotubes and their application as super-capacitor electrodes", Nature Materials, 2006. vol. 5, pp. 987-994.
Gabay, T., et al., Engineered self-organization of neural networks using carbon nanotube clusters Physica A, 2005, vol. 350, pp. 611-621.
Glazachev, Y.I., "Fluorescence Photobleaching Recovery Method with Pulse-Position Modulation of Bleaching/Probing Irradiation", J. Fluoresc., 2009, vol. 19, No. 5, pp. 875-880.
Guittet, M., et al., "Use of Vertically-Aligned Carbon Nanotube Array to Enhance the Performance of Electrochemical Capacitors", Proceedings of the 11th International Conference on Nanotechnolgy IEEE, 2011, pp. 1-6.
Haggenmueler, R., et al., "Aligned single-wall carbon nantubes in composites by melt processing methods", Chemical Physical Letters, vol. 330, 2000, pp. 219-225.
Haq, M.I., et al., "Clinical adminisration of microneedles: skin puncture, pain and sensation", Biomedical Microdevices, 2009, vol. 11, pp. 35-47.
Hart, A.J., et al., "Rapid Growth and Flow-Mediated Nucleation of Millimeter-Scale Aligned Carbon Nanotube Structures from a Thin-Film Catalyst", J. Phys. Chem. B, 2006, vol. 110, pp. 8250-8257.
Hattori, H., et al., "A Novel Real-Time Fluorescent Optical Imaging System in Mouse Heart, A Powerful Tool for Studying Coronary Circulation and Cardiac Function", Circ Cardiovasc Imaging, 2009, vol. 2, pp. 277-278.
Hearn, E.M., et al., "Transmembrane passage of hydrophobic compounds through a protein channel wall", Nature, 2009, vol. 458, pp. 367-371.

(56) References Cited

OTHER PUBLICATIONS

Hinds, B.J., et al., "Aligned Multiwalled Carbon Nanotube Membranes", Science. vol. 303. 2004, pp. 62-65.
Holzapfel, G.A., et al., "Anistropic Mechanical Properties of Tissue Components in Human Atherosclerotic Plaques", J. Bio. Eng., 2004, vol. 126, pp. 657-665.
Hosono, M. et. al., "Intraoperative fluorescence imaging during surgery for coronary artery fistula", Interact CardioVasc Thorac Surg, 2010, vol. 10, pp. 476-477.
Hu, H., et al., "Chemically Functionalized Carbon Nanotubes as Substrates for Neuronal Growth", Nanoletters, 2004, vol. 4, No. 3, pp. 507-511.
Huang, H., et al., "Aligned Carbon Nanotube Composite Films for the Thermal Management", Advanced Materials, vol. 17, No. 13, 2005, pp. 1652-1656.
Huang, X., et al., "Inherent-opening-controlled pattern formation in carbon nanotube arrays", Nanotechonology, vol. 18, 2007, pp. 1-6.
Huber, C.A., et al., "Nanowire Array Composites", Science, vol. 263, 1994, pp. 800-802.
Huczko, A., et al., "Physiological Testing of Carbon Nanotubes: Are They Asbestos-Like?", Fullerene Science and Technology, 2001, vol. 9, No. 2, pp. 251-254.
Huczko, A., et al., "Pulmonary Toxicity of 1-D Nanocarbon Materials", Fullerenes, Nanotubes, and Carbon Nonostructures, 2005, vol. 13, pp. 141-145
Ijima, S., "Helical microtubules of graphitic carbon", Nature, vol. 354, 1991, pp. 56-58.
Jia, G., et al., "Cytotoxicity of Carbon Nanomaterials: Single-Wall Nanotube, Multi-Wall Nanotube, and Fullerene", Environ. Sci. Technol., 2005, vol. 39, pp. 1378-1383.
Jin, L., et al., "Alignment of carbon nanotubes in a polymer matrix by mechanical stretching", Applied Physics Letters, vol. 73, No. 9, 1998, pp. 1197-1199.
Jousseaume, V., et al., : "Few graphene layers/carbon nanotube composites grown at complementary-metal-oxide-semiconductor compatible temperature", Applied Physics Letters, 2011. vol. 98. pp. 12103-1-12103-3.
Jung, Y.J., et al., "Aligned Carbon Nanotube-Polymer Hybrid Architectures for Diverse Flexible Electronic Applications", Nanoletters. vol. 6, No. 3, 2006, pp. 413-418.
Kam, N.W.S., et al., "Carbon nanotubes as multifunctional biological transporters and near-infrared agents for selective cancer cell destruction", PNAS, vol. 102, No. 33, 2005, pp. 11600-11605.
Kaushik, S., et al., "Lack of Pain Associated with Microfabricated Microneedles", Anesthesia Analgesia, 2001, vol. 92. pp. 502-504.
Kazaoui, S., et al., "Near-infrared photoconductive and photovoltaic devices using single-wall carbon nanotubes in conductive polymer films", Journal of Applied Physics, 2005, vol. 9B, pp. 084314-1-084314-6.
Kim, P., et al., "Thermal Transport Measurements of Individual Multiwalled Nanotubes", Physical Review Letters, vol. 87, No. 21, 2001, pp. 215502-1-2015502-4.
Kim, Yeu-Chun, et al., "Microneedles for drug and vaccine delivery", Adv. Drug Delivery Reviews, 2012, vol. 64, No. 14, pp. 1547-1568.
Kim, Youn-Su, et al., "Out-of-plane growth of CNTs on grapheme for supercapacitor applications", Nanotechnology, 2012, vol. 23, pp. 1-7.
Kondo, D., et al., "Self-organization of Novel Carbon Composite Structure: Graphene Multi-Layers Combined Perpendicularly with Aligned Carbon Nanotubes", Applied Physics Express, 2008, vol. 1, No. 7, pp. 074003-1-074003-3.
Kopterides, P., et al., "Statins for sepsis: a critical and updated review", Clin Microbiol infect, 2009, vol. 15, No. 4, pp. 325-334.
Krishnan, A., et al "Young's modulus of single-walled nanotubes", Physical Review B, 1998, vol. 58, No. 20, pp. 14013-14015.
Lahiff, E., et al., "Selective Positioning and Density Control of Nanotubes within a Polymer Thin Film", Nanoletters, vol. 3, No. 10, 2003, pp. 1333-1337.

Lam, C.W., et al., "Pulmonary Toxicity of Single-Wall Carbon Nanotubes in Mice 7 and 90 Days After Intratracheal Instillation", Toxicol Sciences. 2004, vol. 77, pp. 126-134.
Lee. C., et al., "Measurement of the Elastic Properties and Intrinsic Strength of Monolayer Graphene", Science, 2008 vol. 321, pp. 385-388.
Lee, J.U., "Photovoltaic effect in ideal carbon nanotube diodes", Applied Physics Letters, vol. 87, No. 7, 2005, pp. 073101-1-073101-3.
Li, W.Z., et al., "Large-Scale Synthesis of Aligned Carbon Nanotubes", Science, vol. 274, 1996, pp. 1701-1703.
Liu, Z., et al., "Drug delivery wth carbon nanotubes for in vivo cancer treatment", Cancer Res., 2008, vol. 68, No. 16, pp. 6652-6660.
Lovich, M.A., et al., "Carrier Proteins Determine Local Pharmacokinetics and Arterial Distribution of Paciltaxel", J. Pharm. Sci., 2001, vol. 90, No. 9, pp. 1324-1335.
Lu, ,J,P., et al., "Carbon Nanotubes and Nanotube-Based Nano Devices", Int. J. Hi. Spe. Ele. Syst., 1998, vol. 9, No. 1, pp. 101-123.
Lyon, B., et al., "Carbon Nanotube Micro-needles for Rapid Transdermal Drug Delivery", APS DFD Meeting, San Diego, CA, Nov. 18, 2012.
Lyon, B., et. al., "Feasibility Study of CNT for Rapid transdermal Drug Delivery", Mater. Res. Soc. Symp. Proc., 2013, vol. 1569, pp. 239-244.
Lyon, B., et al "Feasibility Study of Carbon Nanotube Microneedles for Rabid Transdermal Drug Delivery", MRS Spring Meeting, San Francisco, CA, Apr. 2013.
Lyon, B., et al., "Carbon Nanotube—Polyimide Composite Microneedles for Rapid Transdermal Drug Delivery", Society of Biomaterials Meeting, Boston, MA, Apr. 2013.
Mamedov, A.A., et al., "Molecular design of strong single-wall carbon nanotube/polyelectrolyte multilayer composites", Nature Materials, 2005, vol. 1, No. 3, pp. 190-194.
Manohara, H.M., et al., "High-current-density field emitters based on arrays of carbon nanotube bundles", J. Vac. Sci. Tech B, 2005, vol. 23, No. 1pp. 157-161.
Mckenzie, J.L., et al., "Decreased functions of astrocytes on carbon nanofiber materials", Biomaterials, 2004, vol. 25, pp. 1309-1317.
Melechko, A.V., et al., "Vertically aligned carbon nanofibers and related structures: Controlled synthesis and directed assembly", Journal of Applied Physics, vol. 97, No. 4, 2005, pp. 041301-1-041301-39.
Migliavacca, F., et al., "Expansion and drug elution model of a coronary stent", Comput Methods Biomech Biomed Engin, 2007, vol. 10, No. 1, pp. 63-73.
Monteiro-Riviere, N.A. et al., "Multi-walled carbon nanotube interactions with human keratinocytes", Toxicol Letters, 2005, vol. 155., pp. 377-384.
Morjan, R.E., et al., "High growth rates and wall decoration of carbon nanotubes grown by plasma-enhanced chemical vapour deposition", Chemical Physics Letters, vol. 383, 2004, pp. 385-390.
Muller, J., et al., "Respiratory toxicity of multi-wall carbon nanotubes", Toxicol Appl Pharmacol, 2005, vol. 207, pp. 221-231.
Nerushev, O.A., et al., "The temperature dependence of Fe-catalysed growth of carbon nanotubes on silicon substrates". Physica B, vol 323, 2002, pp. 51-59.
Nessim, G.D., et al., "Tuning of Vertically-Aligned Carbon Nanotube Diameter and Areal Denslty through Catalyst Pre-Treatment", Nano Letters., 2008, vol. 8, No. 11, pp. 3587-3593.
Noca, F., et al., "NanoWicks: Nanofiber-Patterned Surfaces for Passive Fluid Transport, Nanopumping, Ultraflitration, Nanomixing, and Fluidic Logic", NASA Tech Briefs, 2007., pp. 1-7.
Oreopoulos, J., et al., "Combinatorial microscopy for the study of protein-membrane interactions in supported lipid bliayers: Order parameter measurements by combined polarized TIRF/AFM", J. Struct. Biol., 2009, vol. 168, pp. 21-36.
Panchagnula, R., et al., "Effect of Lipid Bilayer Alteration on Transdermal Delivery of a High-Molecular-Weight and Lipophilic Drug: Studies with Paclitaxer", J. Pharm. Sci., 2004, vol. 93, No. 9, pp. 2177-2183.
Pandolfo, A.G., et al., "Carbon properties and their role in supercapacitors". Journal of Power Sources, 2006, vol. 157, pp. 11-27.

(56) References Cited

OTHER PUBLICATIONS

Parekh, H., et al., "The Transport and Binding of Taxol", Gen Pharmac., 1997, vol. 29, No. 2, pp. 167-172.
Pernodet. N., et al., "Pore size of agarose gels by atomic force microscopy", Electrophoresis, 1997, vol. 18. pp. 55-58.
Prausnitz, .M.R., et al., "Transdermal drug delivery", Nature Biotechnology, 2008, vol. 26, No. 11, pp. 1261-1268.
Price, R.L., et al., "Selective bone cell adhesion on formulations containing carbon nanofibers", Biomaterials, 2003, vol. 24, pp. 1877-1887.
Raravikar, N.R., et al., "Synthesis and Characterization of Thickness-Aligned Carbon Nanotube-Polymer Composite Films", Chem. Mater., vol. 17, No. 5, 2005. pp. 974-988.
Raravikar, N.R., et al., "Embedded Carbon-Nanotube-Stiffened Polymer Surfaces", Small, vol. 1, No. 3, 2005, pp. 317-320.
Ren, Z.F., et al., "Synthesis of Large Arrays of Well-Aligned Carbon Nanotubes on Glass", Science, vol. 282, 1998, pp. 1105-1107.
Roxhed, N., et al., "Painless Drug Delivery Through Microneedle-Based Transdermal Patches Featuring Active Infusion", IEEE Transactions on Biomedical Engineering, 2008, vol. 55, No. 3, pp. 1063-1071.
Ruoff, R.S., et al., "Is C₆₀ stiffer than diamond?", Nature, 1991, vol. 350, pp. 663-864.
Sansom, E.B., "Experimental Investigation on Patterning of Anchored and Unanchored Aligned Carbon Nanotube Mats by Fluid Immersion and Evaporation", PhD Thesis, California Institute of Technology, Pasadena, CA, 2007.
Scheller, B., et al. "Paclitaxel Balloon Coating, a Novel Method for Prevention and Therapy of Restenosis", Circulation, vol. 110, No. 7, 2004, pp. 810-814.
Scheuplen, R.J., et al., "Permeability of the Skin". Physiologicai Reviews, 1971, vol. 51, No. 4. pp.702-747.
Scheuplein, R.J., Chapter 19: Permeability of the skin, Handbook of Physiology—Reactions to Environmental Agents, 2011, pp. 299-322.
Sethi, S., et al., "Gecko-Inspired Carbon Nanotube-Based Self-Cleaning Adhesives", Nanoletters, vol. 8, No. 3, 2008, pp. 822-825.
Shvedova A.A., et al. "Exposure to Carbon Nanotube Material: Assessment of Nanotube Cytotoxicity Using Human Keratinocyte Cells", J. Toxicol. Environ. Health, Pat A, 2003, vol. 66, pp. 1909-1926.
Sinha, N., et al., "Carbon Nanotubes for Biomedical Applications", IEEE Transactions on Nanobioscience, vol. 4, No. 2, 2005, pp. 180-195.
Suh, J.S., et al., "Highly ordered two-dimensional carbon nanotube arrays", Applied Physics Letters, vol. 75, No. 14, 1999, pp. 2047-2049.
Talapatra, S., et al., "Direct Growth of Aligned Carbon Nano-tubes on Bulk Metals", Nature Nanotechnology, 2006, vol. 1, pp. 112-116.
Tamura, K., et al., "Effects of Micro/Nano Particle Size on Cell Function and Morphology", Key Engineering Materials, 2004, vols. 254-256, pp. 919-922.
Tanaka, E., et al., "Real-Time Assessment of Cardiac Perfusion. Coronary Angiography, and Acute Intravascular Thrombi Using Dual-Channel Near-Infrared Fluorescence Imaging", Thorac Cardiovasc Surg., 2009. vol. 138, No. 1, pp. 133-140.
Tepe, G., et al., "Paclitaxel-coated Angioplasty Catheters for Local Drug Delivery", Touch Briefings—interventional Cardiology, 2007 pp. 61-83.
Tian, B., et al., "Coaxial silicon nanowires as solar ceils and nanoelectronic power sources", Nature, vol. 449, 2007, pp. 885-888.
Veedu, V.P., et al., "Muitifunctional composites using reinforced laminae with carbon-nanotube forests", Nature Materials, 2006. vol. 5, pp. 457-462.
Wagner, H.D., et al., "Stress-induced fragmentation of multiwall carbon nanotubes in a polymer matrix", Applied Physics Letters, vol. 72, No. 2, 1998, pp. 188-190.
Wang, G.X., et al., "Growth and Lithium Storage Properties of Vertically Aligned Carbon Nanotubes", Metals and Materials Intl, 2006, vol. 12, No. 5, pp. 413-416.
Wardle, B.L., et al., "Fabrication and Characterization of Ultrahigh-Volume-Fraction Aligned Carbon Nanotube-Polymer Composites", Adv. Mater., 2008, vol. 20, pp. 2707-2714.
Warheit, D.B., et al., "Comparative Pulmonary Toxicity Assessment of Single-wall Carbon Nanotubes in Rats", Toxicol. Sciences, 2004, vol. 77, pp. 117-125.
Waseda, K., et al., "Intraoperative Fluorescence Imaging System for On-Site Assessment of Off-Pump Coronary Artery Bypass Graft", JACC: CardioVasc Imaging, 2009, vol. 2, No. 5, pp. 604-612.
Webster, T.J., et al., "Nano-biotechnology: carbon nanofibres as improved neural and orthopaedic implants", Nanotechnology, 2004, vol. 15, pp. 48-54.
Wermeling, D.P., et al., "Microneedles permit transdermal of a skin-impermeant medication to humans", PNAS, 2008, vol. 105, No. 6, pp. 2058-2063.
Wong, E.W., et al., "Nanobeam Mechanics: Elasticity, Strength, and Toughness of Nanorods and Nanotubes". Science, vol. 277, 1997, pp. 1971-1975.
Wu, W., et al., "Covalently Combining Carbon Nanotubes with Anti-cancer Agent: Preparation and Antitumor Activity", ACS Nano, 2009. vol. 3, No. 9, pp. 2740-2750.
Xie. Xl., et al., "Dispersion and alignment of carbon nanotubes in polymer matrix: A review", Mat. Science and Engineering R, vol. 49, No. 4, 2005, pp. 89-112.
Xu, J. et al., "Enhanced Thermal Contact Conductance Using Carbon Nanotube Array Interfaces", IEEE Transactions on Components and Packaging Technologies, 2006, vol. 29, No. 2, pp. 261-267.
Xu, Z., et al., "Multiwall Carbon Nanotubes Made of Monochirality Graphite Shells", J. Am. Chem. Soc., vol. 128, No. 4, 2006, pp. 1052-1053.
Yang, D. at al., "Hydrophilic multi-walled carbon nanotubes decorated with magnetite nanoparticles as lymphatic targeted drug delivery vehicles", Chem. Commun., 2009, pp. 4447-4449.
Yang, ZP, et al., "Experimental Observation of an Extremely Dark Material Made By a Low-Density Nanotube Array", Nanoletters, vol. 8, No. 2, 2008, pp. 446-451.
Yurdumakan, B., et al., "Synthetic gecko foot-hairs from multiwalled carbon nanotubes", Chem. Comm. vol. 30, 2005, pp. 3799-3801.
Zhang, L.L., et al., "Graphene-based materials as supercapacitor electrodes", J. Matter. Chem., 2010, vol. 20, pp. 5893-5992.
Zhao, L., et al., "Porous Silicon and Alumina as Chemically Reactive Templates for the Synthesis of Tubes and Wires of SnSe, Sn, and SnO2", Angew. Chem. Int. Ed., vol. 45, 2006, pp. 311-315.
Zhou, J.J., et al. "Flow conveying and diagnosis with carbon nanotube arrays", Nanotechnology, vol. 17, No. 19, 2006, pp. 4845-4853.
Zilberman, M. et al., "Paclitaxel-eluting composite fibers: Drug release and tensile mechanical properties", J. Biomed. Mater. Res., 2008 vol. 84A, pp. 313-323.

\* cited by examiner (a)

(b)

SIMPLE METHOD FOR PRODUCING SUPERHYDROPHOBIC CARBON NANOTUBE ARRAY

CROSS-REFERENCES TO RELATED APPLICATIONS

This application claims priority to U.S. Provisional Application No. 61/321,831, filed Apr. 7, 2010. The contents of this priority document and all other references disclosed herein are incorporated in their entirety for all purposes.

BACKGROUND OF THE INVENTION

Wetting properties of materials have interested researchers for decades, due to their relevance to numerous applications. The wetting properties of a material are dictated by its surface chemistry (Emsley, J., *Chemical Society reviews*, 9(1):91-124 (1980); Wenzel, R. N., *Industrial & Engineering Chemistry*, 28(8):988-994 (1936)) and its topographic structure (Bhushan, B. et al., *Philosophical transactions—Royal Society. Mathematical, Physical and engineering sciences*, 367 (1894):1631-1672 (2009); Gao, L. and McCarthy, T. *Langmuir*, 23(18):9125-9127 (2007); Gao, L. and McCarthy, T., *Journal of the American Chemical Society*, 128(28):9052-9053 (2006); Krupenkin, T. et al., *Langmuir*, 20(10):3824-3827 (2004)).

Many investigations have been conducted to understand the surface properties of superhydrophobic materials. A superhydrophobic surface is extremely difficult to wet; it typically has a static contact angle higher than 150° and a contact angle hysteresis less than 10°. Wang, S, and Jiang, L., *Advanced materials*, 19(21):3423-3424 (2007); Men, X. et al., *Applied physics. A, Materials science & processing*, 98(2):275-280 (2010); Bhushan, B. et al., *Philosophical transactions— Royal Society. Mathematical, Physical and engineering sciences*, 367(1894):1631-1672 (2009).

Superhydrophobic materials can be utilized as a protective coating for creating a self-cleaning, nonstick surface (e.g., for solar panels) and for preventing biofouling. Scardino, A. J. et al., *Biofouling: The Journal of Bioadhesion and Biofilm Research*, 25(8):757-767 (2009). They can be used as electrodes to store charge energy in a non-aqueous supercapacitor. They can also be employed to reduce hydrodynamic skin friction drag in laminar and turbulent flow. Rothstein, J., *Annual Review of Fluid Mechanics*, 42(1):89-109 (2010). Without intending to be bound by theory, the existence of a thin layer of trapped air at the liquid-solid interface is believed to allow a slip velocity at the wall of superhydrophobic material, reducing shear stress or momentum transfer from the flow to the wall. Ou, J. et al. *Physics of Fluids*, 16:4635-4643 (2004); Min, T.; Kim, J. *Physics of Fluids* 16:L55-L58 (2004); Daniello, R. J. et al. *Physics of Fluids* 21, online publ. no. 085103 (2009). This effect can produce advantages at macro- or micro-scale. For example, superhydrophobic materials could reduce fuel consumption of marine vessels and the efficiency of liquid pipelines. They also could be used in drug delivery devices to protect the device or drug from contact with blood, and they could be used to alter the mechanical response of cells.

In recent years, production of synthetic materials that exhibit superhydrophobic behavior has been reported. Among these materials, vertically aligned, multi-walled carbon nanotube arrays have gained enormous attention, due to their simple fabrication process and inherent two-length scale topographic structure. Efforts have been made to modify the surface chemistry of the carbon nanotube arrays so that their wetting properties can be tuned precisely. The carbon nanotube arrays can be made hydrophilic by functionalizing their surfaces with oxygenated surface functional groups that allow hydrogen bonds with water molecules to form or hydrophobic by removing those oxygenated surface functional groups from their surfaces.

Various oxidation processes can be used to functionalize the surface of carbon nanotube arrays, such as high-temperature annealing in air, UV/ozone treatment, oxygen plasma treatment, and acid treatment. Processes like high-temperature annealing in air and oxygen plasma treatment would be very costly to implement in large scale, not to mention highly probable to over-oxidize the carbon nanotube if an incorrect recipe were used. The acid treatment is generally hazardous, making it inconvenient to work with. On the other hand, the UV/ozone treatment is a simple, safe, and cost-efficient method of producing more hydrophilic carbon nanotubes.

However, no analogous simple, safe, cost-efficient process has yet been identified for producing superhydrophobic carbon nanotubes. Previously reported studies suggest that complicated processes are always involved in producing superhydrophobic carbon nanotube arrays. In order to make these arrays superhydrophobic, they have to be coated with non-wetting chemicals such as poly(tetrafluoroethylene) (PTFE), zinc (II) oxide, and fluoroalkylsilane, (Huang, L. et al., *The journal of physical chemistry, B*, 109(16):7746-7748 (2005); Lau, K. et al., *Nano Lett.*, 3(12):1701-1705 (2003); Feng, L. et al., *Advanced materials*, 14(24):1857-1860 (2002)) or be modified by plasma treatments, such as CF4, CH4, and NF3. (Hong, Y. and Uhm, H., *Applied physics letters*, 88(24):244101 (2006); Cho, S. et al., *Journal of materials chemistry*, 17(3):232-237 (2007)); Balu, B. et al. *Langmuir*, 24:4785-4790 (2008). However, no prior art has reported a method for producing a superhydrophobic CNT array surface from pure CNTs grown by a simple self-assembly process.

In view of the foregoing, there is a need for a simple, safe, cost-efficient process for producing superhydrophobic carbon nanotubes. Such a process could help to speed the investigation and the commercial application of superhydrophobic carbon nanotubes. The present invention satisfies these and other needs.

BRIEF SUMMARY OF THE INVENTION

In one embodiment, the present invention presents a method for producing a hydrophobic carbon nanotube (CNT) array, the method comprising:

providing a vertically aligned CNT array; and performing vacuum-pyrolysis on the CNT array to produce the hydrophobic nanotube array. Preferably, the hydrophobic nanotube CNT array is superhydrophobic (i.e., a superhydrophobic CNT array).

Preferably, the vacuum-pyrolysis step is performed under reduced pressure of about 0.5 torr to about 10 torr. More preferably, the vacuum-pyrolysis step is performed under reduced pressure of about 1 torr to about 5 torr.

Preferably, the vacuum-pyrolysis step is performed at a reaction temperature of about 100° C. to about 500° C. More preferably, the vacuum-pyrolysis step is performed at a reaction temperature of about 125° C. to about 300° C.

Preferably, the vacuum-pyrolysis step has a duration of about one hour to about five hours.

Preferably, the vertically aligned CNT is anchored on a surface. Preferably, the vertically aligned CNT array is a member selected from a single-wall CNT array, a multiwall CNT array, and a mixture of a single-wall CNT array and a multiwall CNT array.

Preferably, the vertically aligned CNT array is synthesized using a synthesis technique that is selected from chemical vapor deposition (CVD), laser ablation, and arc discharge. Preferably, the vertically aligned CNT is provided by a CVD process. In one aspect of the invention, the CVD process is continuous with the vacuum-pyrolysis step.

Preferably, the method for producing a hydrophobic CNT array further comprises an oxidation step before the vacuum pyrolysis step to remove amorphous carbon.

Preferably, the method for producing a hydrophobic CNT array further comprises removing contamination using the vacuum-pyrolysis step.

Preferably, an outer surface of the superhydrophobic CNT array is at least 85% free from oxygen-containing impurities. More preferably, the outer surface is at least 95% free from oxygen-containing impurities.

Preferably, the CNT array's static water droplet contact angle increases between about 5% to 45% after the vacuum-pyrolysis step. Preferably, the water droplet roll-off angle decreases by at least twofold. Preferably, more than one method is used to assess the array's superhydrophobicity (e.g., static water droplet contact angle and water droplet roll-off angle). Preferably, the static water droplet contact angle is between about 160° to 180°. Preferably, the water droplet roll-off angle is from about 1° to 5°, which means that a water droplet would not maintain a stable position on the surface of the array when the surface is tilted more than the roll-off angle.

Preferably, an outer surface of the superhydrophobic CNT array is at least 85% free from oxygen-containing impurities. More preferably, the outer surface is at least 95% free from oxygen-containing impurities. Still more preferably, the outer surface is at least 97% free from oxygen-containing impurities.

In another embodiment, the present invention presents a hydrophobic CNT array, wherein the hydrophobic CNT array is produced by any of the methods claimed herein. Preferably, the hydrophobic CNT array is superhydrophobic.

These and other aspects, objects and embodiments will become more apparent when read with the detailed description and drawings that follow.

DETAILED DESCRIPTION OF THE INVENTION

I. DEFINITION OF TERMS

Figure 1:
FIG. 1. (a) Low-magnification scanning electron mircroscope (SEM) image of vertically aligned carbon nanotube array. (b) High-magnification SEM image of the same array showing the presence of some entanglements on the array's top surface.
Figure 1:
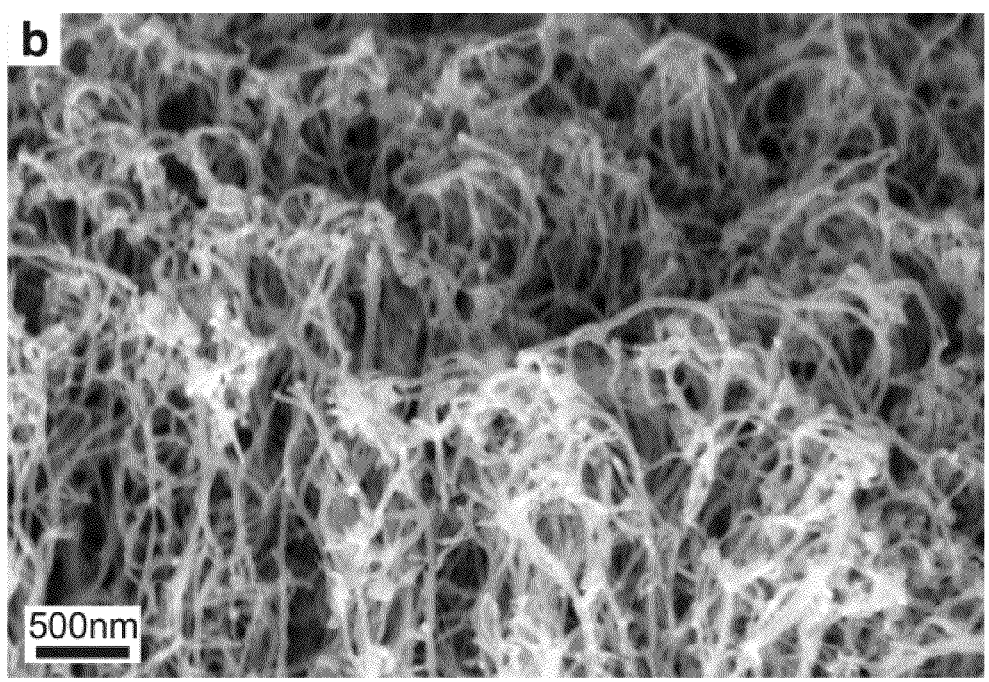

The terms "a," "an," or "the" as used herein not only includes aspects with one member, but also includes aspects with more than one member. For example, an embodiment including "a vertically aligned CNT array" should be understood to present certain aspects with at least a second vertically aligned CNT array.

The term "about" as used herein to modify a numerical value indicates a defined range around that value. If "X" were the value, "about X" would generally indicate a value from 0.95X to 1.05X. Any reference to "about X" specifically indicates at least the values X, 0.95X, 0.96X, 0.97X, 0.98X, 0.99X, 1.01X, 1.02X, 1.03X, 1.04X, and 1.05X. Thus, "about X" is intended to teach and provide written description support for a claim limitation of, e.g., "0.98X." When the quantity "X" only includes whole-integer values (e.g., "X carbons"), "about X" indicates from (X−1) to (X+1). In this case, "about X" as used herein specifically indicates at least the values X, X−1, and X+1.

When "about" is applied to the beginning of a numerical range, it applies to both ends of the range. Thus, "from about 5 to 45%" is equivalent to "from about 5% to about 45%." When "about" is applied to the first value of a set of values, it applies to all values in that set. Thus, "about 7, 9, or 11%" is equivalent to "about 7%, about 9%, or about 11%."

A "hydrophobic" surface indicates a surface that is difficult to wet because of its chemical composition or geometric microstructure. A hydrophobic surface has a static contact angle greater than 90°.

The term "or" as used herein should in general be construed non-exclusively. For example, an embodiment of "a composition comprising A or B" would typically present an aspect with a composition comprising both A and B. "Or" should, however, be construed to exclude those aspects presented that cannot be combined without contradiction.

The term "outer surface of the carbon nanotube array" as used herein includes a side or face of an array that is not directly affixed to its support. Typically, the outer surface would be more likely to contact the surrounding environment. For example, typical tests for roll-off angles would place the drop of liquid in contact with the outer surface of the array, not the inner surface, which would be the side of the array affixed to the support.

A "superhydrophobic" surface indicates a surface that is extremely difficult to wet because of its chemical composition or geometric microstructure. A superhydrophobic surface has at least one of the following characteristics: a static contact angle greater than 150°, a contact angle hysteresis less than 10°, or a roll-off angle less than 5°. Preferably, a superhydrophobic surface has two of these characteristics; more preferably, all three characteristics.

II. EMBODIMENTS

In one embodiment, the present invention presents a method for producing a hydrophobic carbon nanotube (CNT) array, the method comprising:

providing a vertically aligned CNT array; and performing vacuum pyrolysis on the vertically aligned CNT array to produce the hydrophobic nanotube array. Preferably, the product CNT array is a superhydrophobic CNT array.

In one aspect, the present invention provides a vacuum pyrolysis process to render carbon nanotube arrays superhydrophobic. Without being bound by theory, such processes are believed to reverse the effects of oxidation by removing the oxygenated functional groups from the surface of the carbon nanotube, while maintaining the macroscopic structures and packing density of the arrays. Therefore, no deposition of any non-wetting foreign material (e.g., polyfluorocarbons such as poly(tetrafluoroethylene); metal salts, such as zinc (II) oxide) on the array is needed to make them superhydrophobic.

The temperature, pressure, and duration of the vacuum pyrolysis can affect the process's efficiency. Typically, a vacuum pyrolysis process that is performed at a moderate vacuum of 2.5 Torr and a temperature of 250° C. for three hours is sufficient to completely deoxidize the array.

Preferably, the vacuum-pyrolysis step is performed under reduced pressure of about 0.5 torr to about 10 torr, such as 0.5, 0.6, 0.7, 0.8, 0.9, 1, 2, 3, 4, 5, 6, 7, 8, 9, or 10 torr. More preferably, the vacuum-pyrolysis step is performed under reduced pressure of about 1 torr to 5 torr or about 1 torr to 3 torr. Alternatively, the vacuum-pyrolysis step is performed under reduced pressure of about 1 torr to 3 torr. In general, lower pressure is preferable. Without intending to be bound by theory, a lower pressure during the reaction favors the oxygen-containing impurities' dissociation from the surface. Higher pressures disfavor the reaction, prolonging reaction times or even preventing production of superhydrophobic CNT arrays.

At sufficiently low pressure, however, further decrease in pressure produces only minor improvement in the reaction. For example, reaction pressures of 1 torr and 0.5 torr produces similar results in the vacuum pyrolysis (e.g., the process produced a similar superhydrophilic surface after approximately the same total reaction time).

When oxygen is present in the ambient gas, however, it can oxidize the surface of the starting CNT array, especially during pyrolysis at high temperatures and relatively high pressures (e.g., >10 torr). Preferably, the pyrolysis is free from oxygen. Alternatively and more preferably, the pyrolysis is substantially free of oxygen, thereby avoiding oxidation of the superhydrophobic CNT surface.

Preferably, the vacuum-pyrolysis step is performed at a reaction temperature of about 100° C. to about 500° C. such as 100° C., 150° C., 200° C., 250° C., 300° C., 350° C., 400° C., 450° C., or 500° C. More preferably, the vacuum-pyrolysis step is performed at a reaction temperature of about 125° C. to 300° C. (e.g., about 250° C.). Low temperatures (e.g., <100° C., <75° C., or <50° C.) are disfavored because they may not provide sufficient energy for the reaction to proceed efficiently. At high temperatures (e.g., >500° C., >575° C., >625° C., >700° C., >800° C., or >900° C.), the nanotubes or their support (especially if the support is an organic polymer) may partially or completely decompose. Generally, higher temperatures produce a higher chance of decomposition and a faster rate of decomposition.

Preferably, the vacuum-pyrolysis step has a duration of about one hour to about five hours. In general, higher temperature and lower pressures during the pyrolysis step tend to decrease the time required to produce a superhydrophobic CNT array. In some aspects, the vacuum pyrolysis can be continuous. In some aspects, the vacuum pyrolysis includes one or more periods of heating (e.g., two, three, or four heating cycles). In certain aspects, the results of the procedure are dependent on the total heating time rather than the number of heating cycles. In one preferred aspect, the present invention provides an iterative process in which the array is subjected to vacuum pyrolysis, assayed for superhydrophobicity, and re-exposed to the vacuum-pyrolysis conditions if the array were not found to be superhydrophobic.

CNT arrays are characterized by the orientation of the individual nanotubes composing the array. In a vertically aligned array, the axis running through the central point of a carbon nanotube's inner diameter is perpendicular to the array's base (i.e., if the nanotubes were pulled straight our from their bases, they would be oriented like the teeth of a comb or the hair on a head). This is in contrast to a horizontal array (e.g., like beads on a string) or a disordered array. Preferably, the CNT arrays of the present invention are vertically aligned arrays. Without intending to be bound by theory, this vertical alignment minimizes each CNT's contact area with water, reducing possible van der Waals forces.

Preferably, the CNT array is anchored on a surface. Non-anchored tubes can be scraped off, which makes it harder for them to maintain their superhydrophobic properties. Preferably, the CNT array is anchored to a silicon wafer base. Alternatively, the CNT array is anchored to a polymeric base (e.g., silicone). Sansom, E.; Rinderknect, D.; Gharib, M. *Nanotech.*, 19, online publ. no. 035302 (2008). Procedures for making anchored, aligned nanotubes and nanotube devices are known to the skilled artisan (e.g., U.S. Patent Application 2009/0130370; U.S. Pat. No. 7,491,628; U.S. Patent Application 2008/0145616; U.S. Patent Application 2010/0196446; Han, Z. J. et al. *Appl. Phys. Lett.* 94, online publ. no. 223106 (2009); Men, X.-H. et al. *Appl. Phys. A*, DOI 10.1007/s00339-009-5425-6 (2009); Li, S. et al. *J. Phys. Chem. B.* 106, 9274-9276 (2002); and Zhang, L. et al. *Langmuir* 25:4792-4798 (2009), which are incorporated by reference in their entirety).

Individual carbon nanotubes within the array can be single-wall or multiwall. Single-wall nanotubes include one layer of carbon separating the inside and outside of the nanotube. The layer may include different patterns of carbon-carbon bonds depending on its two-dimensional bond geometry. Multiwall nanotubes include more than one layer of carbon separating the inside and outside. The multiple layers may be from a sheet wrapping over itself or from separate, concentric nanotubes. Preferably, the vertically aligned CNT array is a member selected from a single-wall CNT array, a multiwall CNT array, and a mixture of a single-wall CNT array and a multiwall CNT array.

A CNT array is also characterized by the packing density of the individual nanotubes composing the array. The packing density is the number of carbon nanotubes in an area; it is determined by the average distance between the different nanotubes in the array. In certain aspects of the present invention, a typical packing density is about $10^6$ CNT/mm$^2$. At this packing density, the distance between nanotubes at this density is about three to four times the diameter of the nanotube.

A higher packing density is generally preferred because more closely associated nanotubes should make the array's surface more hydrophobic.

In certain preferred aspects, a major advantage of the present invention is its ability to make even very short superhydrophobic CNT arrays. Previous studies have suggested that short CNT arrays cannot become superhydrophobic. Lau, K. K. S. et al. *Nano Lett.* 3:1701-1705 (2009); Liu, H. et al. *Soft Matter,* 2:811-821 (2006). However, by using vacuum-pyrolysis methods, CNT arrays can be made superhydrophobic regardless of length. For example, a CNT array as short as 10 µm can be converted into a superhydrophobic array.

Preferably, the vertically aligned CNT array is synthesized using a synthesis technique that is selected from chemical vapor deposition (CVD), laser ablation, and arc discharge, using procedures commonly known to the skilled artisan. Preferably, the vertically aligned CNT is provided by a CVD process (e.g., Seo, J. W. et al. *New J. Physics,* 5, 120.1-120.22 (2003)).

Carbon nanotube arrays can also be prepared using other procedures known to the skilled artisan, such as those set forth in U.S. Pat. No. 7,491,628; U.S. Patent Application No. 2008/0145616; U.S. Patent Application No. 2003/0180472; and U.S. Patent Application 2010/0247777.

In some aspects, the CVD process is continuous with (or at least partially continuous with) the vacuum-pyrolysis step. For example, if the CVD process is continuous with the vacuum-pyrolysis step, the vacuum-pyrolysis process can be merged with the CNT growth process to form a continuous process (e.g., if there is no need to anchor the CNT array). During the cool-down from CVD synthesis of nanotubes, a vacuum is applied rather than a flowing inert gas. In some aspects, this modification eliminates a need for inert gas purging.

Some CNT arrays can contain residual catalyst particles or amorphous carbon, e.g., from the CNT synthesis. These impurities may create defects in the array. In certain aspects, the process set forth in the present invention further comprises an oxidation step before the vacuum-pyrolysis step to remove amorphous carbon. Preferably, if analytical techniques indicated a significant amount of catalyst particle leftovers or amorphous carbon in the CNT array, the array could be treated with ozone to oxidize the impurities before the vacuum pyrolysis (e.g., by exposure to 185 nm UV radiation in air for 1 hr).

Various other oxidation processes can be used to remove catalyst particles leftovers or amorphous carbon other than the ozone treatment. These other processes include hot air annealing, oxygen plasma treatment, and acid (usually a mixture of nitric acid and hydrochloric acid) treatment (e.g., Tohji, K. et al. *Nature,* 383:679 (1996)). While hot air annealing, oxygen plasma treatment, and acid treatment are each more effective in removing the catalyst particles leftovers and amorphous carbon than the ozone treatment, these processes are harsher so that the chance to over-oxidize the CNT array is high.

The easiest way to find catalyst particle leftovers and amorphous carbon is by performing electron microscopy analysis on the CNT samples; preferably, by using transmission electron microscopy (TEM) on the CNT samples. If the catalyst particles are only found inside the CNTs and if the thickness of amorphous carbon is much less than the diameter of the CNTs, the preliminary oxidation is unnecessary.

In one aspect, a preliminary oxidation is performed if (i) there is any sign of more than one catalyst particle on the average (e.g., preferably, the mean) found on the outer surface of each CNT or (ii) the thickness of amorphous carbon is more than the diameter of the CNT. For example, if TEM indicated 76 surface catalyst particles in a sample comprising 75 nanotubes, the array would be oxidized, but if TEM indicated only 75 or fewer particles in the sample, the array would not be oxidized. Alternatively, if the average number of outer surface catalyst particles is at least one, the array is oxidized to remove them. In some preferred aspects, about 25 to 250, about 50 to 200, or about 60 to 200 CNTs are examined by TEM to make this determination.

Some CNT arrays can contain other impurities or contaminants that may adversely affect the array's properties. These impurities may be volatile or may decompose into volatile products under vacuum-pyrolysis conditions. In certain aspects, the process set forth in the present invention further comprises removing contamination using the vacuum-pyrolysis step.

Preferably, the vacuum-pyrolysis step removes oxygen-bearing impurities from an outer surface of the CNT array. More preferably, the oxygen-bearing impurities are organic (i.e., carbon-containing). Oxygen-bearing, organic impurities can include organic compounds containing hydroxyl, carbonyl (e.g., aldehyde or ketone), or carboxyl (e.g., carboxylic acid) groups. Alternatively, the impurities can be organic, oxygen-bearing groups chemically bonded to the surface of the CNT array (e.g., a carboxy group with a covalent, carbon-carbon bond attaching it to a carbon nanotube).

Preferably, the water droplet roll-off angle decreases at least two-fold; preferably, the angle decreases from two- to twenty-fold. This is the general assay for superhydrophobicity, but others can be used. Preferably, more than one method is used (e.g., static water droplet contact angle and water droplet roll-off angle). Preferably, the static water droplet contact angle increases between about 5% to about 45%, such as 5%, 10%, 15%, 20%, 25%, 30%, 35%, 40%, or 45% after the vacuum-pyrolysis step.

Preferably, the static water droplet contact angle is between about 160° to 180° (alternatively, the static water droplet contact angle is at least 150°; preferably, at least 160°; and more preferably, at least 170°). Surfaces with static water droplet contact angles of at least 160° are extremely hydrophobic, making them particularly useful (i.e., they are not subject to the "petal effect" allowing water to be pinned to the surface). Preferably, the water droplet roll-off angle is from about 1° to 5°, such as about 1°, 2°, 3°, 4°, or 5°; more preferably, the roll-off angle is from about 1° to 3° (e.g., about 1°). Preferably, the contact angle hysteresis is at most 10°, such as between about 1° to 10° (e.g., about 1°, 2°, 3°, 4°, 5°, 6°, 7°, 8°, 9°, or 10°); more preferably, the contact angle hysteresis is at most 5°.

The outer surface of the CNT array can also be monitored for oxygen-bearing bonds as a way to identify the method's progress. Such monitoring can be carried out with conventional methods (e.g., quantitative FTIR). Preferably, an outer surface of the superhydrophobic CNT array is at least 85% free from oxygen-containing impurities. More preferably, the outer surface is at least 95% free from oxygen-containing impurities. Still more preferably, the outer surface is at least 97% free from oxygen-containing impurities. Alternatively, the outer surface can be free from oxygen-containing impurities to the instrument's effective limit of detection.

In another embodiment, the present invention presents a superhydrophobic CNT array, wherein the hydrophobic CNT array is produced by any of the methods claimed herein. Preferably, the hydrophobic CNT array is superhydrophobic.

In certain preferred aspects, a major advantage of the present invention is the use of a simple, high-yielding procedure (vacuum pyrolysis) to produce superhydrophobic CNT arrays. Known methods of generating superhydrophobic CNT arrays are generally low-yielding, may involve corrosive reagents (e.g., the corrosive gases used in plasma treatment), and may change other properties of the CNT array's surface (e.g., treatment with metal oxide, which makes a continuous metal oxide surface). The present invention presents an alternative method for generating superhydrophobic arrays that is simpler and more efficient. In addition, it better preserves the microstructure of the CNT array.

In certain preferred aspects, another advantage of the present invention is the effects of the removal of oxygen-containing impurities from the CNT array's outer surface to produce superhydrophobic CNT arrays. Known methods of generating superhydrophobic CNT arrays are generally low-yielding, may involve corrosive reagents (e.g., the corrosive gases used in plasma treatment), and may change other properties of the CNT array's surface (e.g., treatment with metal oxide, which makes a continuous metal oxide surface). The present invention's removal of oxygen-containing impurities is a simpler and more efficient method of producing superhydrophobic arrays. In addition, it better preserves the microstructure of the CNT array.

III. EXAMPLES

It is understood that the examples and embodiments described herein are for illustrative purposes only. Various modifications or changes thereof will be suggested to persons skilled in the art, and they are to be included within the purview of this application and the scope of the appended claims. In addition, each reference provided herein is incorporated by reference in its entirety to the same extent as if each reference was individually incorporated by reference.

Example 1

Preparation of Superhydrophobic CNT Arrays

Carbon nanotube arrays used in this study were grown by the standard chemical vapor deposition (CVD) technique on a silicon substrate, using hydrogen and ethylene as the precursor gas. Sansom, E. et al., *Nanotechnology*, 19(3):035302 (2008). The average length of all the arrays was chosen to be about 14±4 μm (FIG. 1a), which was about the minimum length that can be made using CVD techniques while preserving the overall vertical alignment and high packing density of the arrays (FIG. 1b). The main reason this length was chosen is for the difficulties in producing a superhydrophobic surface out of short carbon nanotube arrays reported in the previously reported studies. Lau, K. et al., *Nano letters*, 3(12):1701-1705 (2003).

The CNT arrays were subjected to vacuum pyrolysis, typically at a vacuum of 2.5 Torr and a temperature of 250° C. for three hours. After the pyrolysis, the array's static contact angle was tested by conventional methods to determine its hydrophobicity. If conventional analytical methods indicated that the array was not superhydrophobic (e.g., if the static contact angle were less than 160°), the array was re-subjected to vacuum pyrolysis for another three hours (or longer if re-analysis after the second pyrolysis indicated that the array was still not superhydrophobic).

Figure 2:
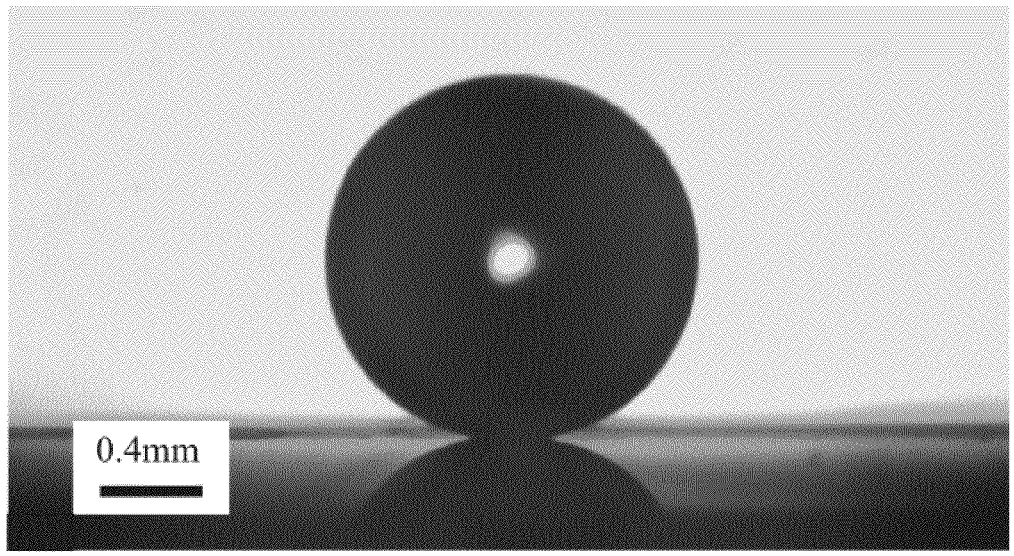
FIG. 2. (a) Water droplet on a superhydrophobic carbon nanotube array exhibiting an almost spherical shape with a 170° (±2°) static contact angle. (b) Time-lapse image of a water droplet bouncing off the surface of a superhydrophobic carbon nanotube array that was tilted 2.5°. Each frame was taken with a 17 ms interval.
Figure 2:
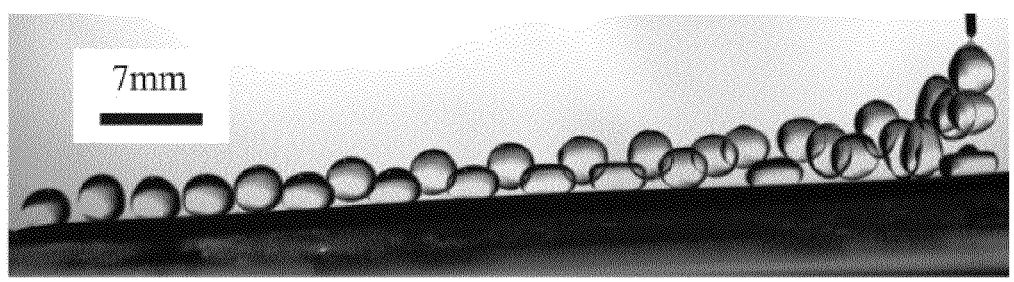

After being subjected to the vacuum-pyrolysis process, the carbon nanotube arrays exhibited extreme water repellency. Their superhydrophobicity was demonstrated by their ultra-high static contact angle of 170°(±2°) (FIG. 2a) and very low contact angle hysteresis of 3°(±1°). These arrays also exhibit a very low roll-off angle of 1° (cf. FIG. 2b, though FIG. 2b shows a roll-off angle of 2.5°). The static contact angle, contact angle hysteresis, and roll-off angles were measured using standard techniques known by the skilled artisan (e.g., contact angles were measured with a contact angle goniometer).

Example 2

Comparison of Post-Vacuum-Pyrolysis CNTs with Control CNTs

Comparison of water-based dispersions of the pre- and post-vacuum pyrolysis carbon nanotubes provides further evidence of the vacuum pyrolysis products' superhydrophobicity. Superhydrophobic CNT arrays were prepared by the method of Example 1. These were compared with non-superhydrophobic control arrays prepared by the same initial procedure, but not subjected to vacuum pyrolysis (contact angle about 143°) as well as hydrophilic CNTs (contact angle about 75°); and strongly hydrophilic CNTs (contact angle about 30°). The water-based dispersions are obtained by scraping the nanotube arrays from their growth substrates and ultrasonically dispersing them in standard industrial deionized water for at least two hours.

Figure 3:
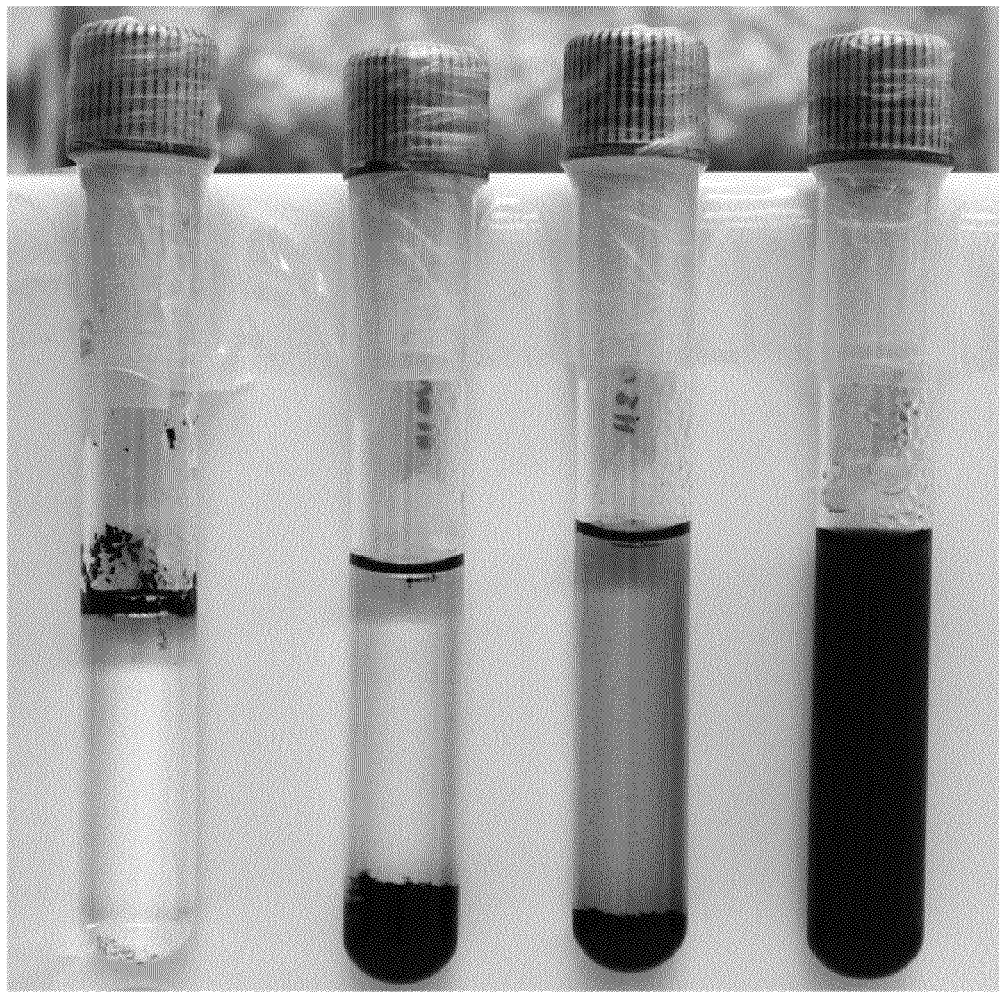
FIG. 3. Dispersion of carbon nanotubes with various wetting properties in industrial deionized (DI) water. The degree of CNT hydrophobicity is decreasing from left to right. The four tubes from left to right are: the dispersion of superhydrophobic CNTs (contact angle about 170°); hydrophobic CNTs (contact angle about 143°); hydrophilic CNTs (contact angle about 75°); and strongly hydrophilic CNTs (contact angle about 30°).

The experiment demonstrated that nanotubes that have been subjected to vacuum-pyrolysis were not dispersed in water even after being sonicated for more than two hours (FIG. 3). In contrast, the more hydrophilic nanotubes can be dispersed easily in water. From this finding, one can conclude that the vacuum-pyrolysis treatment is capable of completely deoxidizing individual nanotubes within the array.

Example 3

FTIR and Electrochemical Characterization of Superhydrophobic CNT Surface Chemistry To study the effect of the vacuum-pyrolysis process on the surface chemistry of the hydrophilic CNTs, FTIR spectrometry analysis was conducted on array samples using standard methods for the skilled artisan. The superhydrophobic samples were compared with hydrophilic samples (contact angle 30°, as per Example 2's strongly hydrophilic CNTs). A small portion of the CNT array (<1 mm$^2$) was scraped from the growth substrate, dispersed in 50 ml deuterated dichloromethane, drop-cast onto a KBr window, and then dried overnight under mild vacuum (>5 torr) and without heating to remove the solvent. The FTIR spectrometry analysis was subsequently performed on the sample using an infrared laser with a wavelength of 2500-12500 nm.

Figure 4:
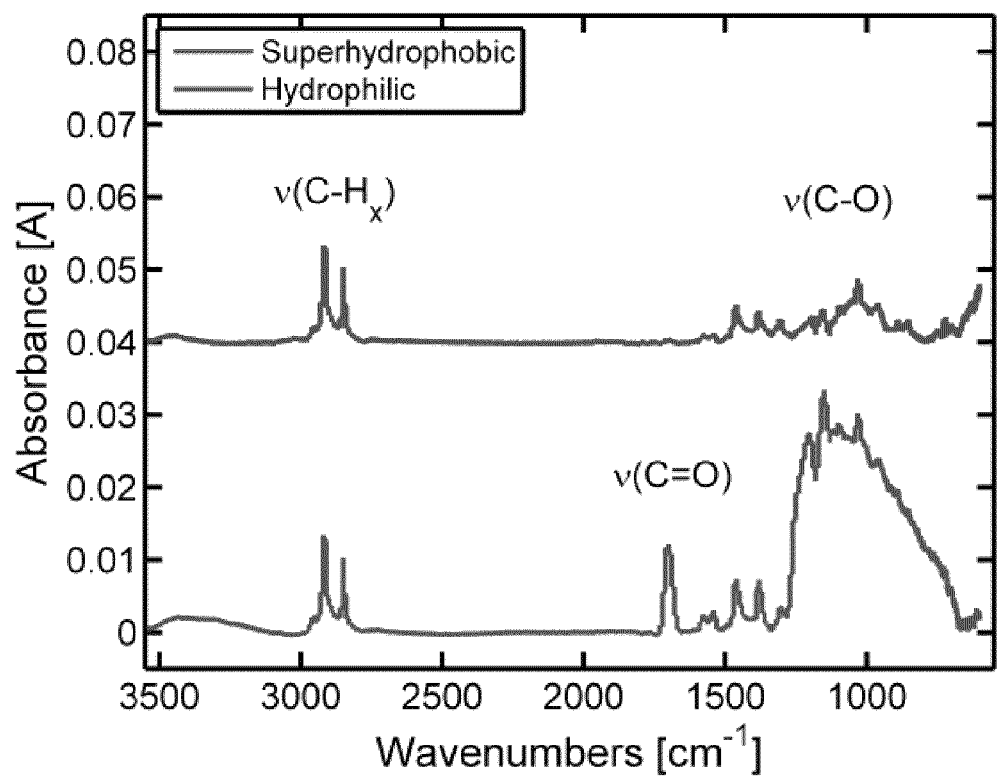
FIG. 4. A typical Fourier-transform infrared (FTIR) spectra from superhydrophobic and hydrophilic carbon nanotube arrays showing strong peaks at 810-1320 $cm^{-1}$, 1340-1600 $cm^{-1}$, 1650-1740 $cm^{-1}$, and 2800-3000 $cm^{-1}$, which indicate the presence of C—O, C=C, C=O, and C—$H_x$ stretching modes respectively.

Four strong bands were detected on the hydrophilic arrays at 810-1320 cm$^{-1}$, 1340-1600 cm$^{-1}$, 1650-1740 cm$^{-1}$, and 2800-3000 cm$^{-1}$, which indicate the presence of C—O, C=C, C=O and C—H$_x$ stretching modes respectively (FIG. 4). The peaks at 970, 1028, 1154 and 1201 cm$^{-1}$ correspond to C—O stretching modes (Kuznetsova, A. et al., *Chemical Physics Letters*, 321(3-4):292-296 (2000)), and the broad shoulder band at 810-1320 cm$^{-1}$ suggests the existence of C—O—C bonds from ester functional groups. Sham, M. and Kim, J., *Carbon*, 44(4):768-777 (2006); Socrates, G., *Infrared and Raman characteristic group frequencies: tables and charts*, 3rd ed. ed., Wiley: Chichester (2001); Mawhinney, D. et al., *Journal of the American Chemical Society*, 122(10): 2383-2384 (2000); Kim, U. et al., *Physical Review Letters*, 95(15):157402 (2005). The peaks at 1378, 1462, 1541 and 1574 cm$^{-1}$ indicate the presence of C=C stretching vibration modes of the carbon nanotube walls. Kuznetsova, A. et al., *Chemical Physics Letters,* 321(3-4):292-296 (2000); Sham, M. and Kim, J., *Carbon,* 44(4):768-777 (2006); Socrates, G., *Infrared and Raman characteristic group frequencies: tables and charts,* 3rd ed. ed., Wiley: Chichester (2001); Mawhinney, D. et al., *Journal of the American Chemical Society,* 122(10):2383-2384 (2000). The narrow band at a peak of 1703 cm$^{-1}$ corresponds to C=O stretching modes of either quinone or carboxylic acid ester groups. Kuznetsova, A. et al., *Chemical Physics Letters,* 321(3-4):292-296 (2000); Sham, M. and Kim, J., *Carbon,* 44(4):768-777 (2006); Mawhinney, D. et al., *Journal of the American Chemical Society,* 122(10):2383-2384 (2000); Kim, U. et al., *Physical Review Letters,* 95(15):157402 (2005).

These FTIR spectra show that the strength of all peaks associated with the C—O and C=O stretching modes of the superhydrophobic array is significantly lower than that of the hydrophilic one, suggesting that the oxygen desorption process does take place during vacuum-pyrolysis treatment. The strength of the C=C stretching modes also seems to decrease slightly, implying that the graphitic structures of the carbon nanotubes were still intact after the vacuum-pyrolysis treatment. The triplet with peaks at 2848, 2915 and 2956 cm$^{-1}$ indicate C—H$_x$ bonds from the hydrocarbon functional group. Kim, U. et al., *Physical Review Letters,* 95(15):157402 (2005). This hydrocarbon triplet peaks seems to be unaffected by vacuum-pyrolysis process, implying that these peaks may be associated with contaminations in the FTIR instrument (Kim, U. et al., *Physical Review Letters,* 95(15):157402 (2005)) and have nothing to do with the wetting properties of the arrays.

Figure 5:
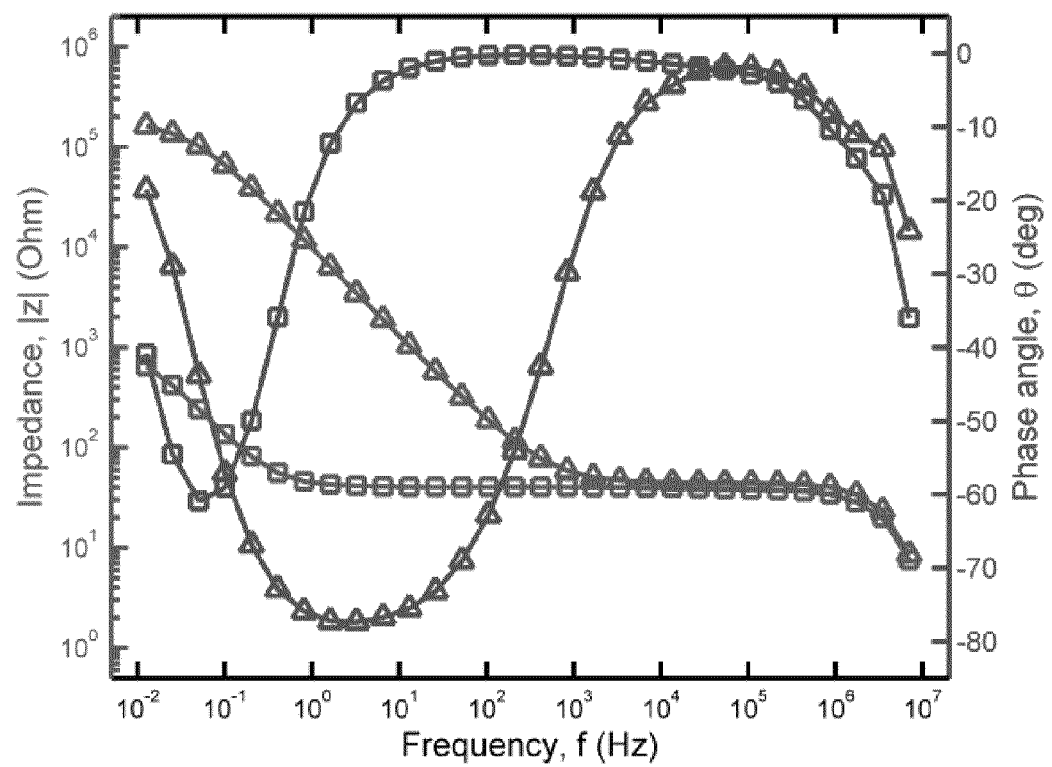
FIG. 5. Electrochemical impedance modulus and phase-angle spectra of carbon nanotube arrays with various wetting properties in 1 M NaCl aqueous solution. Superhydrophobic and hydrophilic arrays are indicated by triangle and square markers respectively.

Just like their wetting properties, the electrochemical properties of carbon nanotube arrays are dictated by their surface chemistry. As shown by the measured impedance modulus and phase angle spectra, carbon nanotube arrays with different wetting properties exhibit different electrochemical properties (FIG. 5). For the superhydrophobic array, the frequency of constant impedance spans for three decades from 1 kHz to 1 MHz. On the other hand, the frequency of constant impedance for the hydrophilic arrays spans for six decades from 1 Hz to 1 MHz. At a low frequency of 10 mHz, the impedance modulus of the superhydrophobic array is about two orders of magnitude higher than that of the hydrophilic one. The impedance of the hydrophilic and the superhydrophilic CNT arrays were found to be about 650Ω and 162 kΩ respectively at frequency of 12 mHz in 1 M NaCl solution. This finding implies that the specific capacitance for hydrophilic and the superhydrophilic CNT array is about 3.3 F/g and 9.1 mF/g respectively.

Without being bound by theory, these findings are the result of a thin film of air on the interface between the surface of the superhydrophobic array and the aqueous electrolyte. This air film inhibits electrons transfer from the arrays and obstructs protons in the electrolyte to approach the surface of the array. On the other hand, the hydrophilic array is completely wetted by the aqueous electrolyte such that there is no air film that may inhibit electron transfer from the arrays. Because of the air film's presence film, the impedance of the superhydrophobic array was measured to be two orders of magnitude higher than that of the hydrophilic one.

Example 4

Flow-Diagram of One Embodiment of the Present Invention

Figure 6:
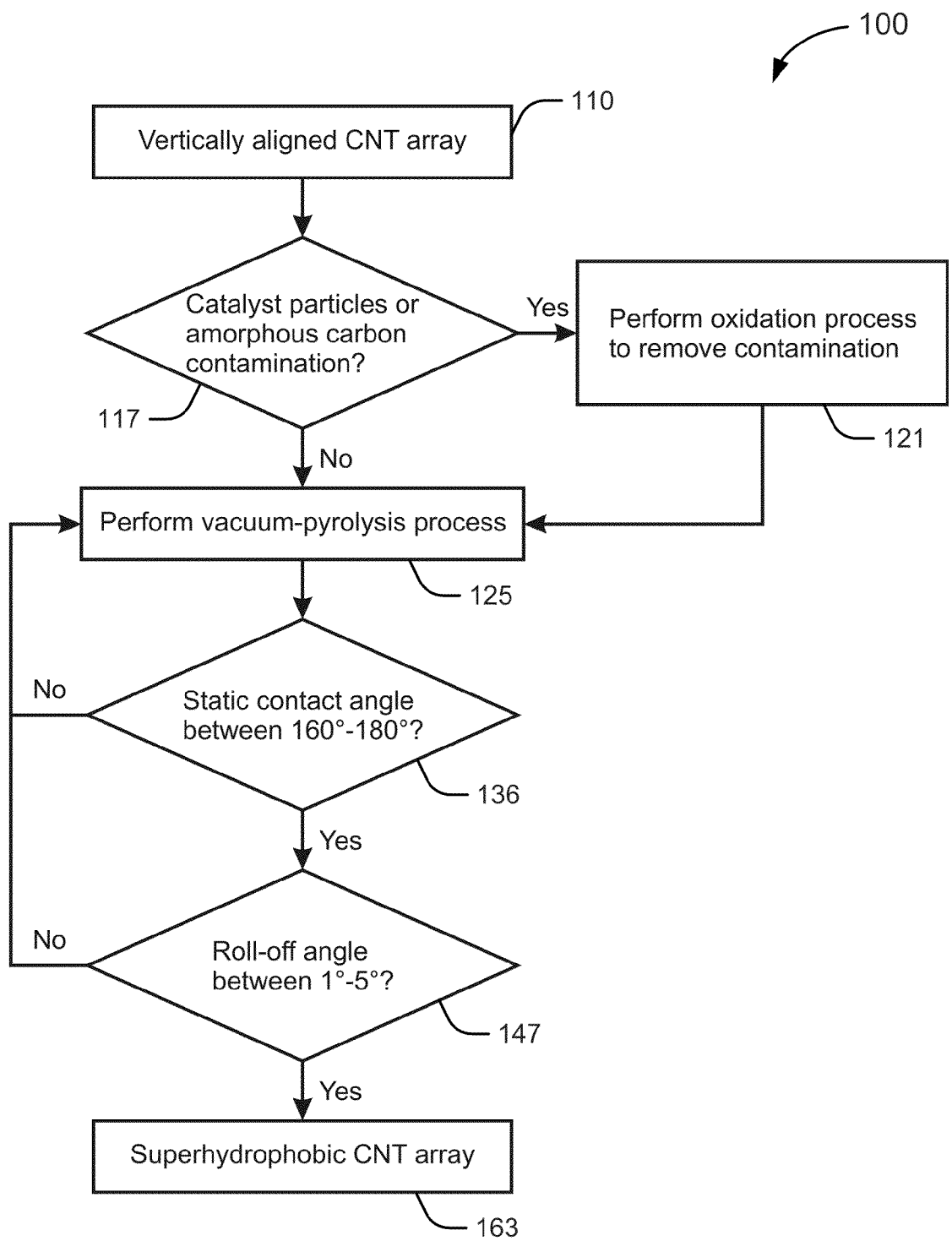
FIG. 6. A process diagram for one embodiment of the present method for making superhydrophobic carbon nanotubes.

This example illustrates a flow diagram of one embodiment of the present invention (FIG. 6). The embodiment provides a vacuum pyrolysis process (100) to render carbon nanotube arrays superhydrophobic. In this instance, beginning with a vertically aligned CNT array (110), the array is analyzed for any catalyst particles or amorphous carbon contamination (117). If either or both of these are present, an oxidation process is performed to remove the contamination (121). Next, a vacuum-pyrolysis step is performed at a reaction temperature and duration as indicated herein (e.g., a temperature selected from about 100° C. to about 500° C. and a duration selected from about one hour to five hours) (125). After the vacuum-pyrolysis step is performed, the static contact angle is determined. In certain embodiments, if the static contact angle is within specification (136), the roll-off angle is determined. In one aspect, if the roll-off angle is within specification (147), the superhydrophobic CNT array is produced (163). If either of the static angle or the roll-off angle are not within specification, the vacuum-pyrolysis step (125) may be performed iteratively to produce the superhydrophobic CNT array (163).

CONCLUSIONS

In conclusion, the discoveries reported herein show that the wetting properties of carbon nanotube arrays can be altered by controlling the amount of oxygenated functional groups that are bonded to their surface. The CNT arrays can be made hydrophilic by oxidizing with, e.g., hot air, strong acids, UV/ozone, or oxygen plasma. The CNT arrays can be made superhydrophobic by deoxidizing with vacuum-pyrolysis treatment at moderate vacuum and temperature. Such vacuum-pyrolysis treatment is capable of removing the oxygenated functional groups that are attached to the CNTs' surfaces.

All publications and patent applications cited in this specification are herein incorporated by reference as if each individual publication or patent application were specifically and individually indicated to be incorporated by reference. Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A method for producing a superhydrophobic carbon nanotube (CNT) array, the method comprising:
   synthesizing a vertically aligned CNT array with a chemical vapor deposition (CVD) process; and
   performing vacuum pyrolysis on the CNT array to produce the superhydrophobic CNT array,
   wherein the vacuum-pyrolysis removes contamination and wherein an outer surface of the superhydrophobic CNT array is at least 85% free from oxygen-containing impurities.

2. The method of claim 1, wherein the outer surface of the CNT array is at least 95% free from oxygen-containing impurities.

* * * * *